(12) United States Patent
Plat et al.

(10) Patent No.: US 6,913,958 B1
(45) Date of Patent: Jul. 5, 2005

(54) METHOD FOR PATTERNING A FEATURE USING A TRIMMED HARDMASK

(75) Inventors: Marina V. Plat, San Jose, CA (US); Marilyn I. Wright, Sunnyvale, CA (US); Chih Yuh Yang, San Jose, CA (US); Douglas J. Bonser, Austin, TX (US)

(73) Assignee: Advanced Micro Devices, Sunnyvale, CA (US)

( * ) Notice: Subject to any disclaimer, the term of this patent is extended or adjusted under 35 U.S.C. 154(b) by 91 days.

(21) Appl. No.: 10/366,800

(22) Filed: Feb. 14, 2003

(51) Int. Cl.⁷ .................... H01L 21/336; H01L 21/84; H01L 21/3205; H01L 21/302

(52) U.S. Cl. .................. 438/197; 438/717; 438/585; 438/151

(58) Field of Search .................. 438/717, 736, 438/197, 766, 778, 585, 719, 151

(56) References Cited

U.S. PATENT DOCUMENTS

| | | | | |
|---|---|---|---|---|
| 6,750,127 B1 | * | 6/2004 | Chang et al. | 438/585 |
| 6,759,286 B2 | * | 7/2004 | Kumar et al. | 438/177 |
| 6,797,552 B1 | * | 9/2004 | Chang et al. | 438/197 |
| 2004/0043590 A1 | * | 3/2004 | Bonser et al. | 438/585 |
| 2004/0087092 A1 | * | 5/2004 | Huang et al. | 438/296 |

* cited by examiner

*Primary Examiner*—David Nelms
*Assistant Examiner*—Chuong Anh Luu
(74) *Attorney, Agent, or Firm*—Foley & Lardner LLP

(57) ABSTRACT

In the formation of a semiconductor device, one or more hardmasks are formed during a process for patterning a device feature. One or more of the hardmasks is subjected to an isotropic etch to trim the hardmask prior to patterning an underlying layer. The trimmed hardmask layer is preferably an amorphous carbon layer.

5 Claims, 5 Drawing Sheets

METHOD FOR PATTERNING A FEATURE USING A TRIMMED HARDMASK

BACKGROUND OF THE INVENTION

1. Field of the Invention

Embodiments of the present invention relate to semiconductor fabrication, and in particular, to methods for obtaining submicron semiconductor device geometries by trimming layers of a structure used in the patterning of an underlying structure.

2. Background Technology

Current semiconductor manufacturing uses a variety of techniques to achieve sub-100 nm gate line widths.

FIG. 1 shows a structure used in the formation of a MOSFET gate line in a conventional process. The structure includes a semiconductor substrate 2 having field oxides 4 that bound source/drain regions of a MOSFET. Layers of a gate insulating material 6 such as silicon oxide and a gate conductive material 8 such as doped polysilicon are formed over the substrate. Formed over the gate conductive layer 8 is a multi-layer hardmask/antireflective coating (ARC) structure including an amorphous carbon layer 10 and an antireflective layer 12 such as silicon carbide, silicon nitride, silicon oxide, silicon oxynitride, $SiRO_x$, or SiRN. A photoresist mask 14 for defining the pattern of the gate is formed on the antireflective layer 12. In conventional processing, a first etch is used to transfer the photoresist mask pattern to the antireflective layer 12, a second etch is used to transfer the antireflective layer 12 mask pattern to the amorphous carbon layer 10, a third etch is used to transfer the amorphous carbon layer 10 mask pattern to the polysilicon gate conductive layer 8, a fourth etch is used to remove oxide from the surface of the patterned polysilicon gate conductive layer, and further etches are performed to pattern the underlying gate insulating layer.

One technique for reducing the size of features patterned in this manner involves trimming the photoresist mask by subjecting it to an isotropic etch prior to patterning of underlying layers. This reduces the width of the mask and therefore the width of the pattern that it transfers to the underlying layer. For example, in FIG. 1 the photoresist mask may be trimmed from its original size 14a to a reduced size 14b. This technique enables reduction of the size of the mask to less than the minimum feature size that can be created in the photoresist material solely through projection lithography.

A disadvantage of the photoresist trim technique is that it becomes more difficult to perform as device dimensions are reduced. Too much trimming leaves too thin a photoresist mask, such that subsequent degradation of the photoresist material during patterning of the underlying layer leads to errors in pattern transfer. While this may be addressed to some extent by using a thicker photoresist layer, too thick a photoresist layer will result in a structure that may be too narrow to support its own height and thus may collapse or fall over.

Consequently, there is a need for supplemental or alternative techniques for reducing semiconductor device geometries.

SUMMARY OF THE INVENTION

In accordance with a preferred embodiment of the invention, a hardmask is subjected to an isotropic etch to trim its width prior to its use as an etch mask for patterning an underlying layer. This trimming may be performed for each layer of a multiple layer hardmask structure, and may also be integrated with photoresist trimming.

In accordance with one embodiment, a substrate is provided that includes a patternable layer such as a gate conductive layer, and at least one hardmask layer formed over the patternable layer. A photoresist mask is then formed on the uppermost hardmask layer of the at least one hardmask layers. The photoresist mask may be trimmed. The pattern of the photoresist mask is then transferred to the patternable layer using hardmasks formed from each of the at least one hardmask layer. At least one hardmask formed from one of the at least one hardmask layers is trimmed prior being used to pattern an underlying layer. Typically the hardmask formed from the uppermost hardmask layer is trimmed. However, a different layer may be trimmed, or more than one layer may be trimmed.

DESCRIPTION OF THE DRAWINGS

Preferred embodiments of the invention will hereafter be described with reference to the accompanying drawings, wherein like numerals denote like elements, and in which.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

Figure 1:
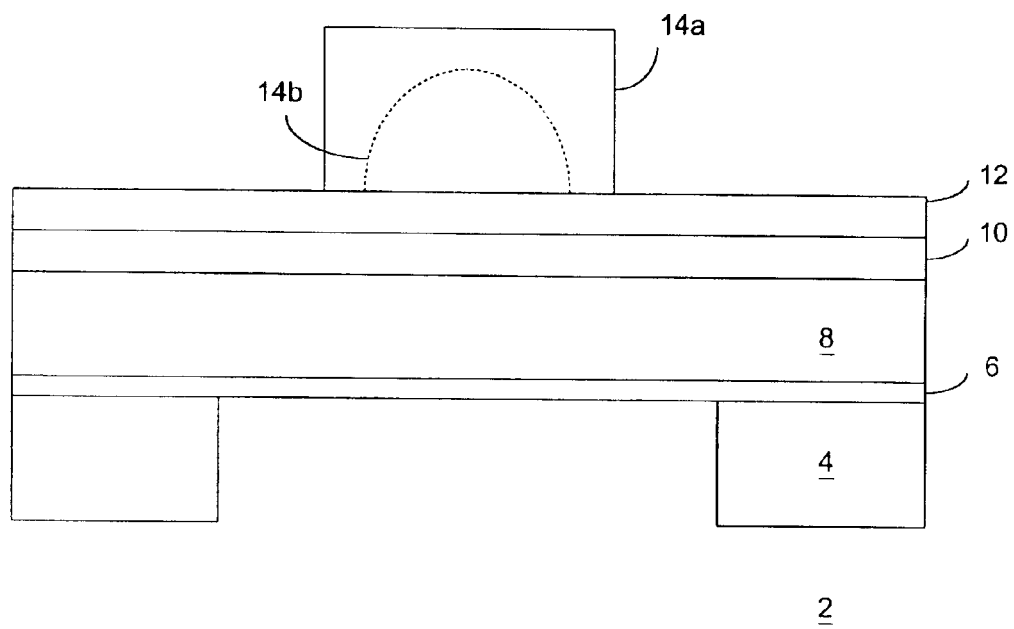
FIG. 1 shows a structure formed during fabrication of a semiconductor device in accordance with a conventional method.
Figure 2A:
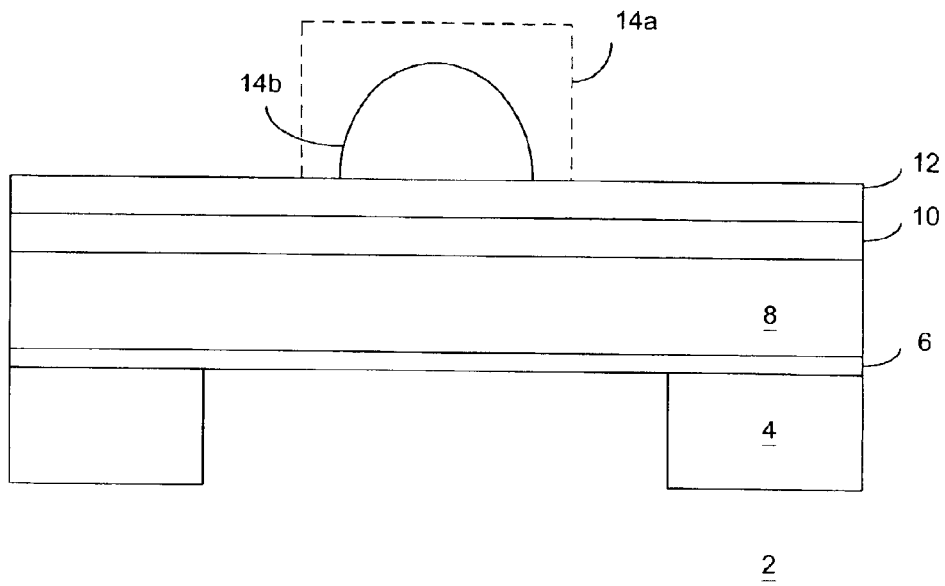
FIGS. 2a, 2b, 2c, 2d, 2e and 2f show structures formed during fabrication of a semiconductor device in accordance with a preferred embodiment of the invention.

FIGS. 2a–2f show structures formed during processing in accordance with a preferred embodiment. FIG. 2a shows the structure of FIG. 1 after a photoresist mask trim process has been performed. The trim process is carried out in a high density plasma reactor (for example an AMAT DPS). A typical trim chemistry uses a mixture of HBr, $O_2$, and Ar. As seen in FIG. 2a, the size of the resulting trimmed photoresist mask 14b is smaller than the size of the original photoresist mask 14a.

Figure 2B:
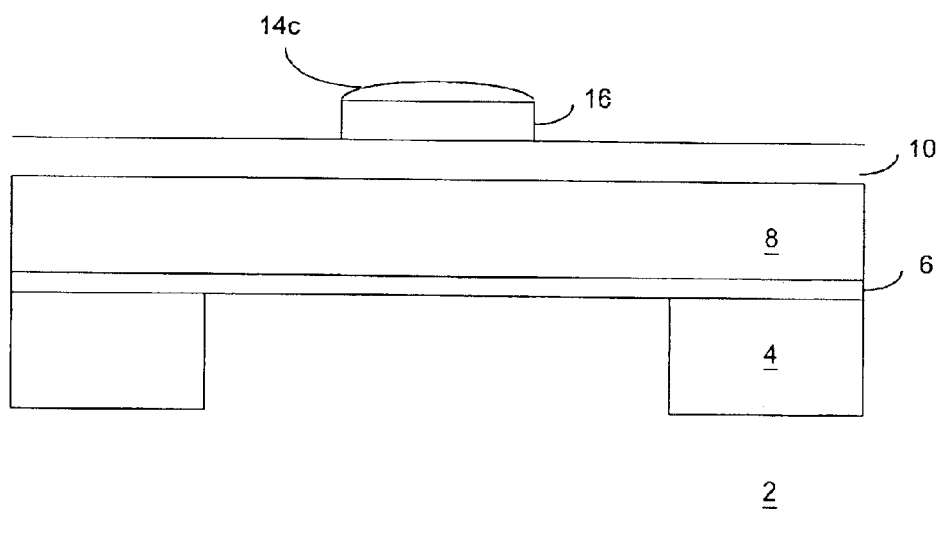

FIG. 2b shows the structure of FIG. 2a after patterning of the antireflective layer to form a first hardmask 16 from the antireflective material. Various etch chemistries may be used depending on the material of the antireflective layer. Typically a small portion 14c of the photoresist mask survives this patterning process.

Figure 2C:
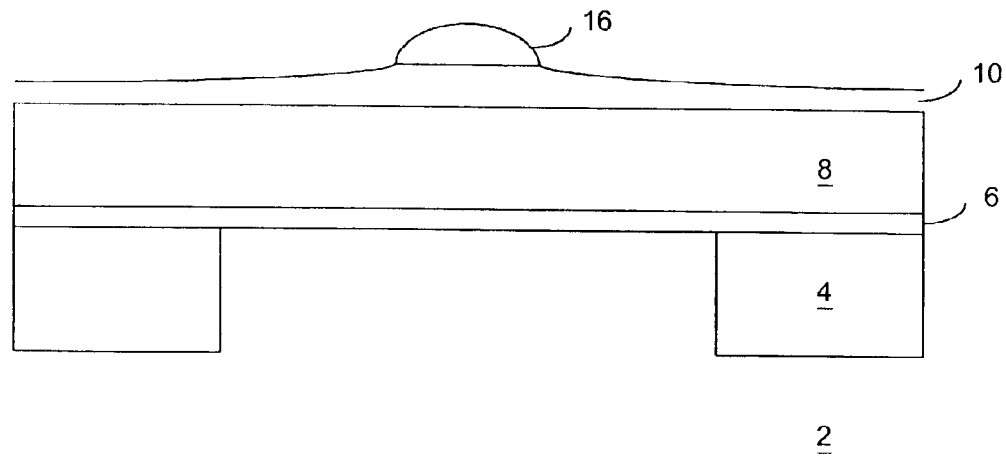

FIG. 2c shows the structure of FIG. 2b after an isotropic trimming etch has been performed on the first hardmask 16 to form a first trimmed hardmask. Various etch chemistries may be used depending on the material of the antireflective layer. As seen in FIG. 2c, this etch may be destructive of the underlying amorphous carbon layer 10. However, the first hardmask 16 protects the underlying portion of the amorphous carbon layer that will be patterned in subsequent processing.

Figure 2D:
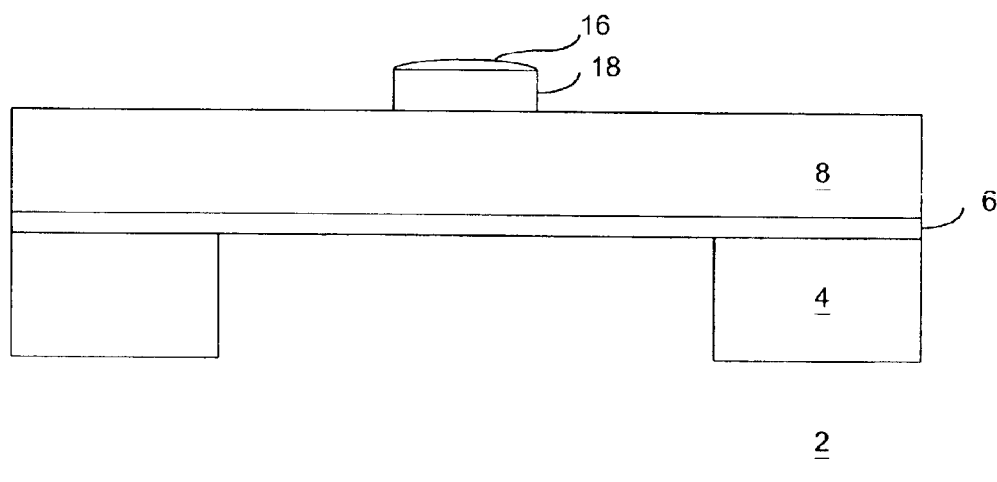

FIG. 2d shows the structure of FIG. 2c after patterning of the amorphous carbon layer using the first hardmask as an etch mask to form a second hardmask 18 from the amorphous carbon material. The amorphous carbon etch process is carried out in a high density plasma reactor (for example an AMAT DPS). A typical amorphous carbon etch chemistry uses a mixture of HBr, $O_2$, and Ar. As seen in FIG. 2d, a small portion of the first hardmask 16 may survive this patterning.

Figure 2E:
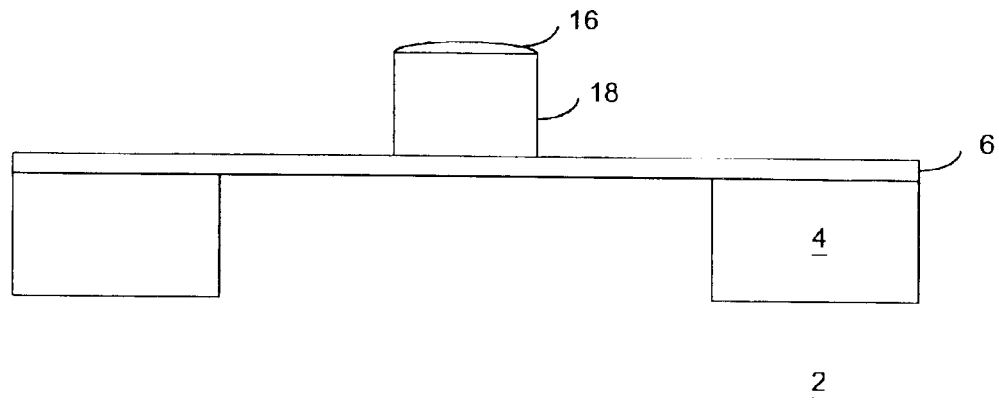

FIG. 2e shows the structure of FIG. 2d after patterning of the polysilicon gate conductive layer using the second hardmask as an etch mask to form a gate line 18 from the polysilicon gate conductive material. The polysilicon etch process is carried out in a high density plasma reactor (for example an AMAT DPS). A typical polysilicon etch chemistry uses multiple steps with gas mixtures of HBr, Cl12, He, and O2. CF4 and N2 may sometimes be included in the etch chemistry. As seen in FIG. 2e, a small portion of the first hardmask 16 may survive this patterning.

Figure 2F:
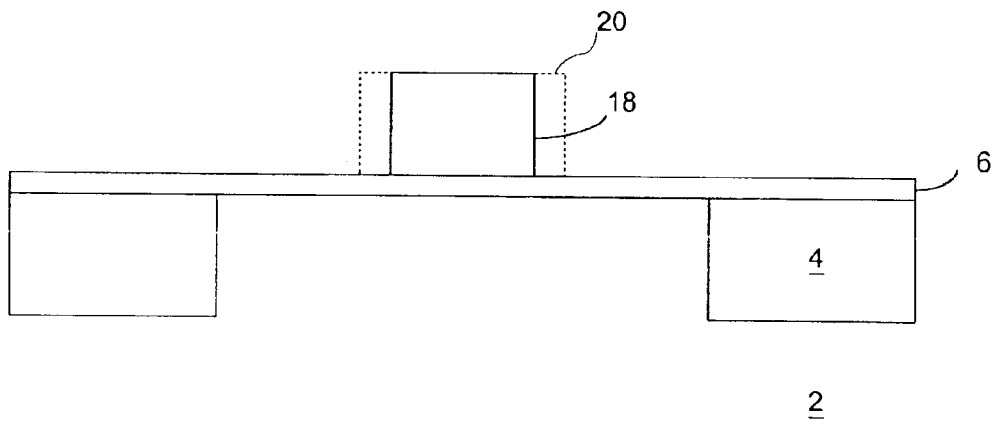

FIG. 2f shows the structure of the gate line 18 after removal of any remaining amorphous carbon. The amorphous carbon may be removed by an ashing process, using $O_2$ or a gas mixture containing $O_2$ and $N_2$. As seen in FIG. 2f, the width of the patterned gate line 18 is substantially narrower than the width of the first hardmask 20 (shown for comparison) that was patterned using the trimmed photoresist mask.

Further processing may be performed after the processing shown in FIGS. 2a–2f, such as formation of spacers, source and drain regions, source and drain contacts, interlevel dielectric, and other types of structures.

While the processing of FIGS. 2a–2f is presently preferred, a number of alternatives are also contemplated. In one alternative, the trimming of the photoresist mask may be omitted. In another alternative, the second hardmask may be trimmed prior to its use in patterning the underlying gate conductive layer, providing further reduction in the feature size that will be produced by such patterning. In a further alternative, a single layer of an antireflective material is utilized as a hardmask layer and is trimmed prior to patterning of an underlying layer. In other alternatives, more than two hardmasks may be used.

Figure 3:
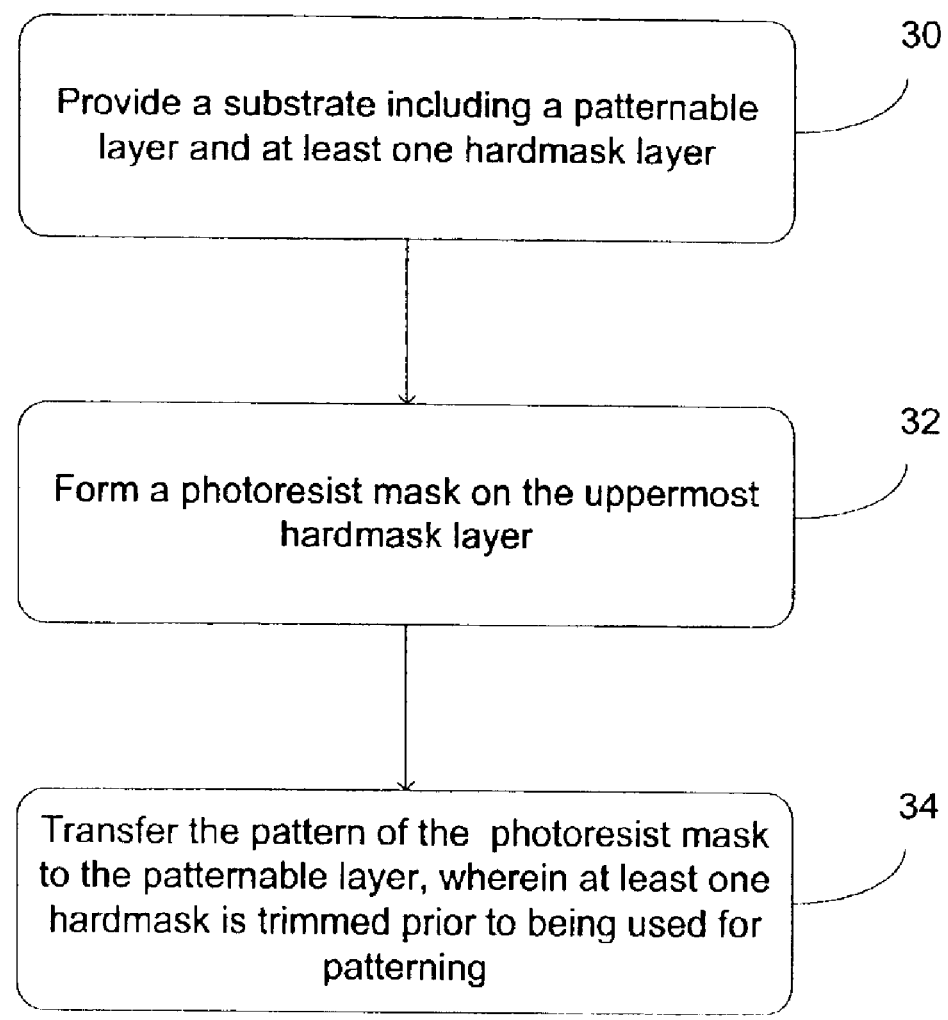
FIG. 3 shows a process flow encompassing the preferred embodiment and alternative embodiments.

FIG. 3 shows a process flow encompassing the preferred embodiment and the aforementioned alternatives as well as other alternatives. Initially a substrate is provided (30). The substrate includes a patternable layer such as a gate conductive layer, and at least one hardmask layer formed over the patternable layer. A photoresist mask is then formed on the uppermost hardmask layer of the at least one hardmask layers (32). The photoresist mask may be trimmed. The pattern of the photoresist mask is then transferred to the patternable layer using hardmasks formed from each of the at least one hardmask layer (34). At least one hardmask formed from one of the at least one hardmask layers is trimmed prior being used to pattern an underlying layer. Typically the hardmask formed from the uppermost hardmask layer is trimmed. However, a different layer may be trimmed, or more than one layer may be trimmed.

Further processing may then be performed, such as such as removing residual hardmask material, patterning a gate oxide layer, or formation of spacers, source and drain regions, source and drain contacts, and other types of structures.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the task specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of claimed inventions and their equivalents.

What is claimed is:

1. A method of forming a semiconductor device comprising:

providing a substrate comprising a patternable layer, an amorphous carbon layer formed on the patternable layer, and a hardmask layer formed on the amorphous carbon layer;

forming a photoresist mask on the hardmask layer;

patterning the hardmask layer to form a first hardmask using the photoresist mask as an etch mask;

subjecting the first hardmask to an isotropic etch to trim the first hardmask;

patterning the amorphous carbon layer to form a second hardmask using the first hardmask as an etch mask; and patterning the patternable layer using the second hardmask as an etch mask.

2. The method claimed in claim 1, wherein patterning the hardmask layer is preceded by subjecting the photoresist mask to an isotropic etch to trim the photoresist mask.

3. The method claimed in claim 1, wherein patterning the patternable layer is preceded by subjecting the second hardmask to an isotropic etch to trim the second hardmask.

4. The method claimed in claim 1, wherein the hardmask layer is formed of a material selected from the group consisting of silicon carbide, silicon nitride, silicon oxide, silicon oxynitride, $SiRO_x$, and SiRN.

5. The method claimed in claim 1, wherein said patternable layer comprises a polysilicon gate conductive layer.

* * * * *